(12) United States Patent
Inoda et al.

(10) Patent No.: US 8,823,115 B2
(45) Date of Patent: Sep. 2, 2014

(54) MICROPHONE UNIT AND VOICE INPUT DEVICE USING SAME

(75) Inventors: Takeshi Inoda, Osaka (JP); Ryusuke Horibe, Osaka (JP); Fuminori Tanaka, Osaka (JP); Akira Funatsu, Tokyo (JP); Michitomo Shibutani, Tokyo (JP)

(73) Assignee: Funai Electric Co., Ltd., Osaka (JP)

(*) Notice: Subject to any disclaimer, the term of this patent is extended or adjusted under 35 U.S.C. 154(b) by 133 days.

(21) Appl. No.: 13/133,515

(22) PCT Filed: Dec. 10, 2009

(86) PCT No.: PCT/JP2009/070654
§ 371 (c)(1),
(2), (4) Date: Jun. 8, 2011

(87) PCT Pub. No.: WO2010/067834
PCT Pub. Date: Jun. 17, 2010

(65) Prior Publication Data
US 2011/0233692 A1    Sep. 29, 2011

(30) Foreign Application Priority Data
Dec. 12, 2008 (JP) ................. 2008-317297

(51) Int. Cl.
*H01L 29/84* (2006.01)
*H04R 1/04* (2006.01)
*H04R 19/04* (2006.01)
*H04R 1/38* (2006.01)
*H04R 19/00* (2006.01)

(52) U.S. Cl.
CPC *H04R 19/04* (2013.01); *H04R 1/38* (2013.01); *H04R 2499/11* (2013.01); *H04R 1/04* (2013.01); *H04R 19/005* (2013.01)

USPC .......................... 257/416; 438/53; 381/357

(58) Field of Classification Search
USPC ............. 438/53; 381/150, 175, 357; 257/416
See application file for complete search history.

(56) References Cited

U.S. PATENT DOCUMENTS 7,808,060 B2 * 10/2010 Hsiao ........................... 257/416
7,868,402 B2 *  1/2011 Huang et al. .................. 257/416
8,049,287 B2 * 11/2011 Combi et al. ................. 257/416

(Continued)

FOREIGN PATENT DOCUMENTS

CN       1441621 A     9/2003
CN       1886000 A    12/2006

(Continued)

OTHER PUBLICATIONS

Supplementary European Search Report (PCT/JP2009070654), Sep. 26, 2013.

*Primary Examiner* — Zandra Smith
*Assistant Examiner* — Toniae Thomas
(74) *Attorney, Agent, or Firm* — Morgan, Lewis & Bockius LLP (57) ABSTRACT

A microphone unit converts voice into an electric signal based on the vibration of a diaphragm contained in an MEMS chip. The microphone unit includes a substrate on which the diaphragm is mounted (the MEMS chip is mounted); a cover member, having sound holes, that is disposed above the substrate so that the diaphragm is contained within the inner space formed between the cover member and the substrate; and a holding member that holds only the substrate or both of the substrate and the cover member.

15 Claims, 6 Drawing Sheets

(56) References Cited

U.S. PATENT DOCUMENTS

| | | |
|---|---|---|
| 2003/0165251 A1 | 9/2003 | Pribyl |
| 2005/0077102 A1 | 4/2005 | Banter et al. |
| 2006/0285707 A1 | 12/2006 | Izuchi et al. |
| 2007/0058826 A1* | 3/2007 | Sawamoto et al. ........... 381/174 |
| 2007/0134839 A1* | 6/2007 | Chang et al. .................... 438/53 |
| 2007/0217635 A1* | 9/2007 | Ogura et al. ................. 381/191 |
| 2008/0083961 A1* | 4/2008 | Suzuki et al. ................. 257/416 |
| 2008/0247585 A1 | 10/2008 | Leidl et al. |
| 2008/0283988 A1* | 11/2008 | Huang et al. .................. 257/680 |
| 2008/0310657 A1 | 12/2008 | Tsuchiya et al. |
| 2008/0315333 A1* | 12/2008 | Combi et al. .................. 257/415 |
| 2009/0140413 A1* | 6/2009 | Wang et al. ................... 257/416 |
| 2009/0180655 A1 | 7/2009 | Tien et al. |
| 2010/0167799 A1 | 7/2010 | Makihata et al. |
| 2012/0027234 A1* | 2/2012 | Goida ........................... 381/150 |

FOREIGN PATENT DOCUMENTS

| | | |
|---|---|---|
| CN | 1917382 A | 2/2007 |
| EP | 1 755 360 A1 | 2/2007 |
| EP | 1 739 933 A1 | 3/2007 |
| EP | 1 901 579 A2 | 3/2008 |
| JP | 7-007299 U | 1/1995 |
| JP | 2003-153392 | 5/2003 |
| JP | 2003-259493 | 9/2003 |
| JP | 2005-295278 | 10/2005 |
| JP | 2007-81614 A | 3/2007 |
| JP | 2007-510326 | 4/2007 |
| JP | 2007-150507 A | 6/2007 |
| JP | 2007-150514 | 6/2007 |
| JP | 2008-072580 | 3/2008 |
| JP | 2008-199353 | 8/2008 |
| JP | 2008-294556 | 12/2008 |
| TW | M341025 U | 9/2008 |

* cited by examiner

MICROPHONE UNIT AND VOICE INPUT DEVICE USING SAME

TECHNICAL FIELD

The present invention relates to a microphone unit that converts voice into an electric signal and a voice input device that includes such a microphone unit.

BACKGROUND ART

Conventionally, microphone units are employed in voice input devices such as voice communication devices including mobile telephones and transceivers, information processing systems that employ techniques for analyzing inputted voice such as voice authentication systems, and recording devices. Recent years have seen a continuation in the miniaturization of electronic devices, and the development of microphone units that achieve smaller and thinner sizes is in full swing.

MEMS (Micro Electro Mechanical System) microphone devices that are created using semiconductor manufacturing techniques are known as microphone units that achieve smaller and thinner sizes (for example, see Patent Documents 1 through 3). Here, an example of the configuration of a conventional microphone unit will be described.

Figure 13:
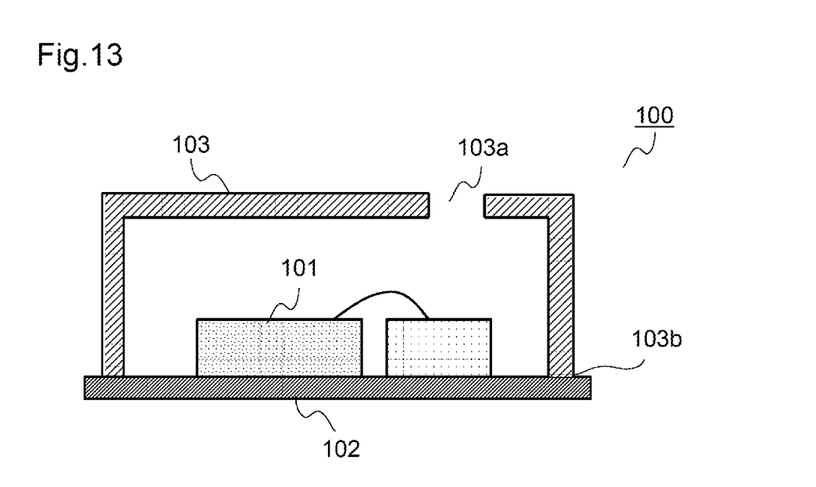
FIG. 13 is a schematic cross-sectional view illustrating an example of the configuration of a conventional microphone unit.

FIG. 13 is a schematic cross-sectional view illustrating an example of the configuration of a conventional microphone unit. As illustrated in FIG. 13, the conventional microphone unit 100 includes an MEMS chip 101 that converts an inputted sound wave into an electric signal, a substrate 102 on which the MEMS chip 101 is mounted, and a shield case 103 that covers the MEMS chip 101. A sound hole 103a for inputting a sound wave from the exterior is formed in the shield case 103.

A bottom end 103b of the shield case 103 is electrically connected to a grounding circuit pattern (not shown) formed in the substrate 102. Through this, the shield case 103 can shield the microphone unit 100 from electromagnetic noise.

CITATION LIST

Patent Documents

Patent Document 1: JP-2007-150514A
Patent Document 2: JP-2008-72580A
Patent Document 3: JP-2008-199353A

SUMMARY OF THE INVENTION

Problems to be Solved by the Invention

With the conventional microphone unit 100 described above, it is necessary, during assembly, to adjust the position of the shield case 103 so that the bottom end 103b of the shield case 103 is connected to the grounding circuit pattern. In addition, it is also necessary to make adjustments so that the positional relationship between the sound hole 103a and the MEMS chip 101 is a predetermined positional relationship. This positioning operation has been problematic in that it has led to a drop in the efficiency of operations when mass-producing the microphone unit 100.

Furthermore, the stated conventional microphone unit 100 is mounted to a mounting substrate in a voice input device using reflow mounting. For this reason, the microphone unit 100 is exposed to high temperatures exceeding 200° C. when the microphone unit 100 is mounted to the mounting substrate, and is then put through a cooling process. Meanwhile, the microphone unit 100 described above is generally mounted to the surface of the mounting substrate; however, even when mounted to the surface of the mounting substrate, the microphone unit 100 is exposed to high temperatures exceeding 200° C. and is cooled thereafter.

Normally, the shield case 103 is formed of a metal, and the substrate 102 is formed of a non-metal (glass epoxy substrate or the like). For this reason, during reflow mounting, stress easily acts on the MEMS chip 101 due to a large difference in the thermal expansion coefficient between the substrate 102 and the shield case 103 that is affixed thereto. This in turn has been a cause of changes in the properties of the MEMS chip 101, thus leading to problems in the properties of the microphone unit 100 after the reflow mounting has been completed.

Accordingly, it is an object of the present invention to provide a microphone unit that can be assembled in an efficient manner. Furthermore, it is another object of the present invention to provide a microphone unit that is capable of reducing the likelihood of problems in the properties of the microphone unit occurring during mounting to a mounting substrate. Further still, it is another object of the present invention to provide a voice input device that includes such a microphone unit and can be manufactured at high yields.

Means to Solve the Problems

In order to achieve the aforementioned objects, a microphone unit according to the present invention is a microphone unit that converts voice into an electric signal based on the vibration of a diaphragm, and includes: a substrate on which the diaphragm is mounted; a cover member, having a sound hole, that is disposed above the substrate so that the diaphragm is contained within the inner space formed between the substrate and the cover member; and a holding member that holds only the substrate or both the cover member and the substrate.

The microphone unit configured in this manner includes the holding member that holds at least the substrate. By employing such a configuration, in which a holding member that holds the substrate is included, the cover member can be attached with ease while the holding member ensures that the positional relationship between the substrate and the cover member remains a constant positional relationship. In other words, this configuration makes it easy to assemble the microphone unit, and makes it possible to improve the efficiency of operations during assembly.

In addition, according to this configuration, the configuration may be such that the holding member is provided between the substrate and the shield cover in the case where the cover member is covered with the shield cover from above in order to shield the microphone unit from, for example, electromagnetic noise. For this reason, in the case where the microphone unit is mounted upon a mounting substrate in a voice input device using reflow mounting, the holding member provided between the substrate and the shield cover can function as a buffer and suppress the occurrence of warping in the substrate, even if there is a large difference in the thermal expansion coefficients of the substrate (the microphone unit substrate) and the shield cover. In other words, it is possible to reduce the likelihood of the occurrence of problems in the properties of the microphone unit when the microphone unit is mounted in a voice input device.

As a specific configuration of the microphone unit configured as described above, the holding member may include a spatial area formed by a base wall and side walls; and the substrate and the cover member may be housed and held within the spatial area. By employing such a configuration, the substrate and the cover member can be positioned relative to each other simply by inserting the substrate and the cover member into the holding member, which makes it very easy to assemble the microphone unit.

In addition, in the microphone unit configured as described above, a depression may be formed in the base wall. More specifically, the sound holes formed in the cover member may include a first sound hole and a second sound hole; and a first sound duct leading from the first sound hole to a first surface of the diaphragm, and a second sound duct leading from the second sound hole through the depression and to a second surface that is the rear surface of the first surface of the diaphragm, may be formed.

By employing such a configuration, the diaphragm of the microphone unit vibrates due to a difference in the sound pressure arising between the first surface and the second surface of the diaphragm. Furthermore, by employing such a configuration, it is easy to obtain an electric signal from which background noise has been eliminated and that contains only a user's voice, which in turn makes it possible to provide a high-performance microphone unit.

In addition, in the microphone unit configured as described above, the diaphragm may be contained in an MEMS chip and the MEMS chip may be mounted upon the substrate. According to this configuration, it is easy to make the microphone unit smaller and thinner, and furthermore, it is possible to mount the microphone unit in a voice input device using reflow mounting.

In addition, the microphone unit configured as described above may further include a conductive shield cover having a sound hole; the sound hole in the cover member and the sound hole in the shield cover may overlap, and the shield cover may be provided so that the holding member is contained within the shield cover. In this configuration, the shield cover and the cover member may be separate members, with the cover member being covered by the shield cover from above, or the shield cover and the cover member may be formed as a single member. Although the shield cover may be attached at the stage in which the microphone unit is mounted in a voice input device, there are also cases where microphone units to which the shield cover has been attached are employed. The present invention is also intended to include such microphone units.

Furthermore, in order to achieve the aforementioned objects, a voice input device according to the present invention includes the microphone unit configured as described above.

Furthermore, in order to achieve the aforementioned objects, a voice input device according to the present invention includes: the microphone unit configured as described above; and a mounting substrate upon which the microphone unit is mounted; the shield cover is electrically connected to a ground formed in the mounting substrate.

As described thus far, with a voice input device that includes the microphone unit configured as described above, the microphone unit can be manufactured in an efficient manner, which makes it possible to reduce the cost of the voice input device. In addition, there is a low likelihood of problems occurring in the properties even in the case where the microphone unit that has been covered by the shield cover is mounted in the voice input device using reflow mounting, and thus the voice input device can be manufactured at high yields.

Advantageous Effects of the Invention

According to the present invention, it is possible to provide a microphone unit that can be assembled in an efficient manner. Furthermore, according to the present invention, it is possible to provide a microphone unit that is capable of reducing the likelihood of problems in the properties of the microphone unit occurring during mounting to a mounting substrate. Further still, according to the present invention, it is possible to provide a voice input device that includes such a microphone unit and can be manufactured at high yields.

EMBODIMENTS FOR CARRYING OUT THE INVENTION

Hereinafter, embodiments of a microphone unit and a voice input device in which the present invention is applied will be described in detail with reference to the drawings.

(Microphone Unit)

Figure 1:
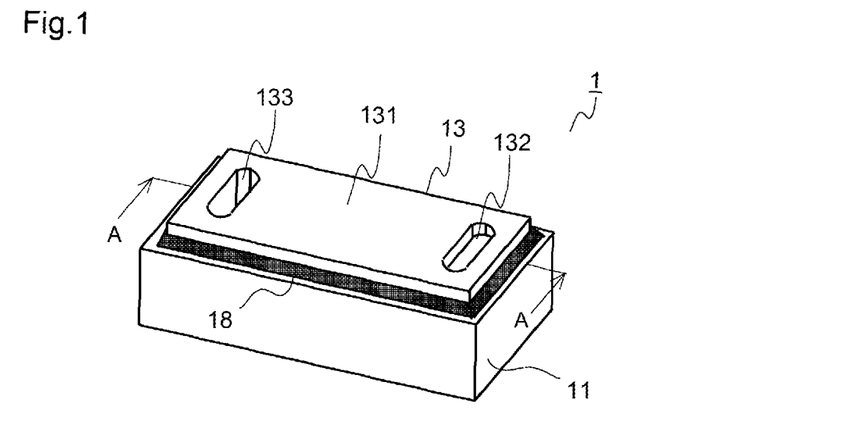
FIG. 1 is a schematic perspective view illustrating the configuration of a microphone unit according to an embodiment of the present invention.
Figure 2:
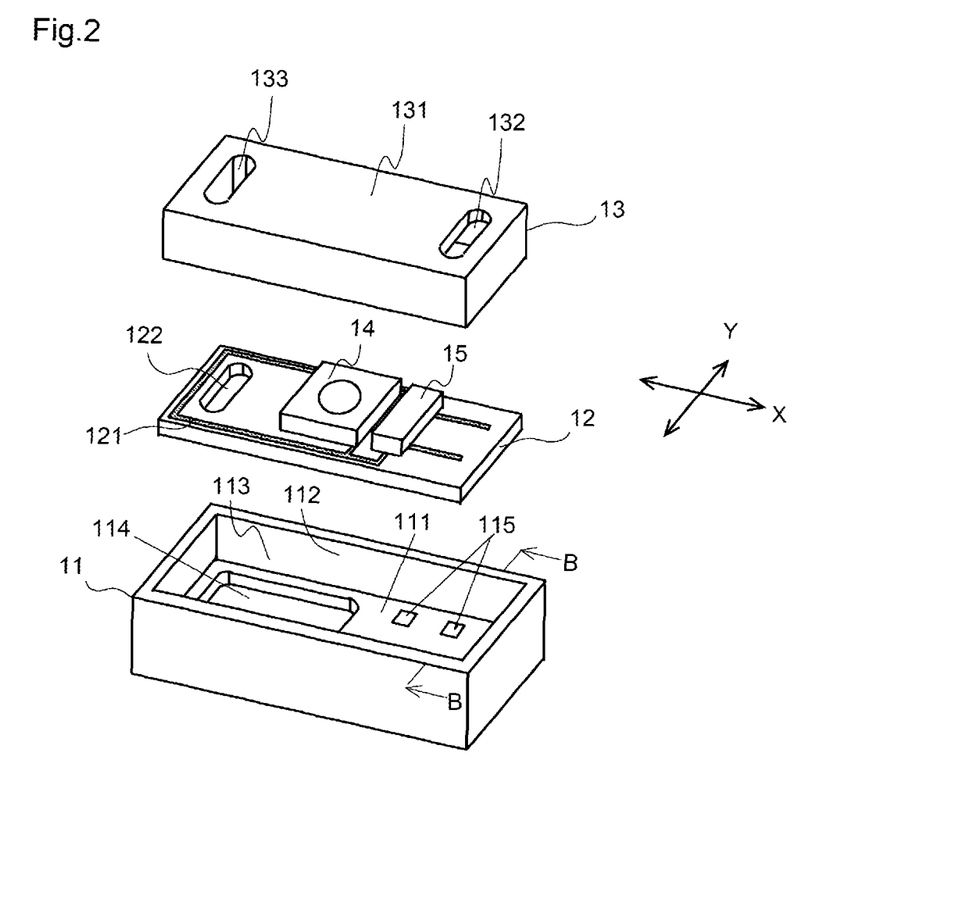
FIG. 2 is an exploded perspective view illustrating the configuration of the microphone unit according to the embodiment.
Figure 3:
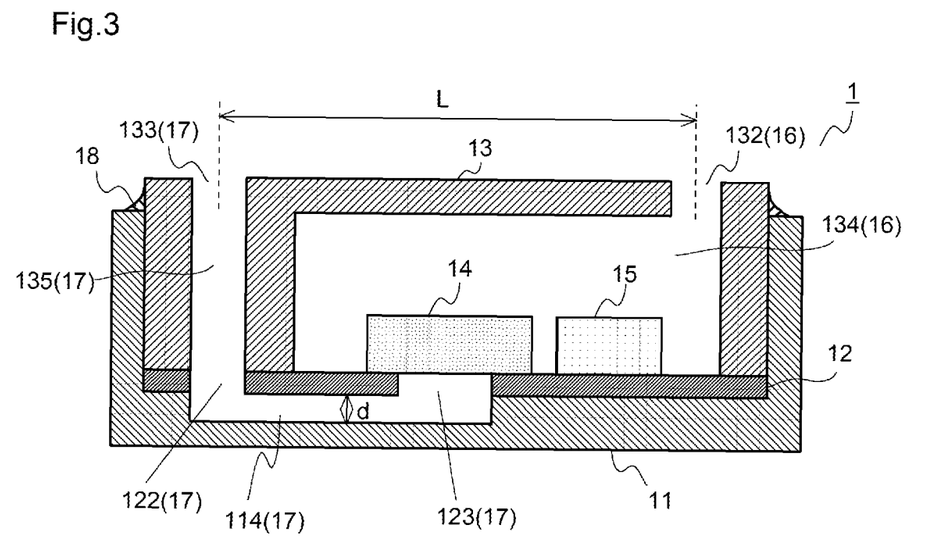
FIG. 3 is a schematic cross-sectional view taken along the A-A line shown in FIG. 1.
Figure 4:
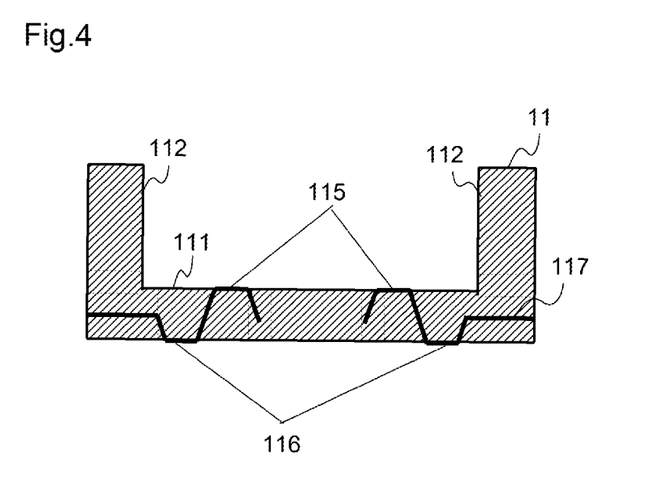
FIG. 4 is a schematic cross-sectional view taken along the B-B line shown in FIG. 2.
Figure 5:
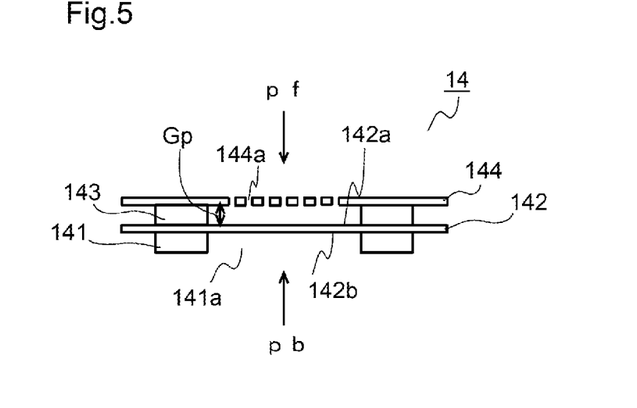
FIG. 5 is a schematic cross-sectional view illustrating the configuration of an MEMS chip provided in the microphone unit according to the embodiment.
Figure 6:
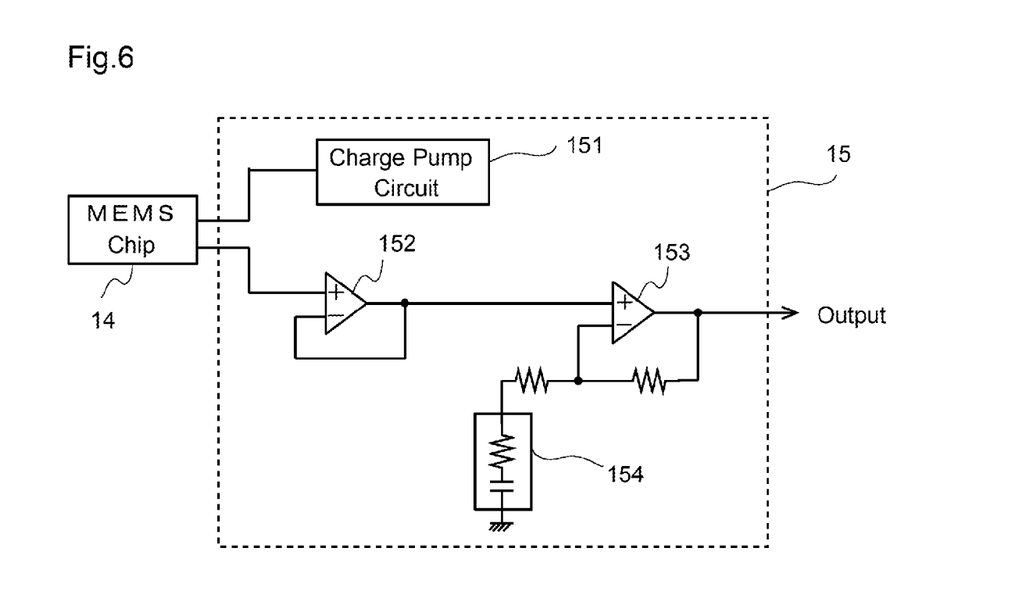
FIG. 6 is a diagram illustrating the circuit configuration of an ASIC provided in the microphone unit according to the embodiment.
Figure 7:
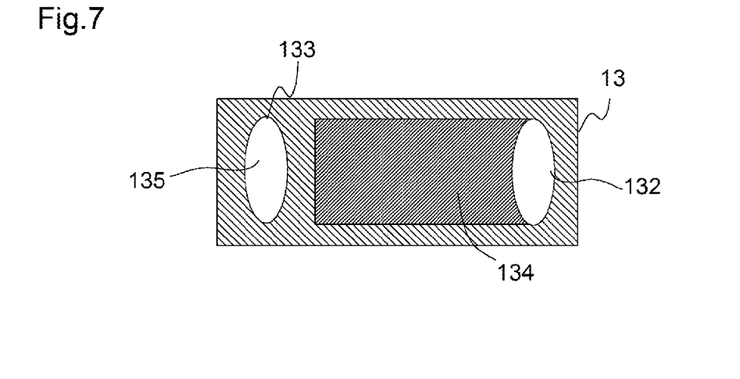
FIG. 7 is a schematic plan view illustrating the configuration of a top case provided in the microphone unit according to the embodiment, viewed from the rear side thereof.

FIG. 1 is a schematic perspective view illustrating the configuration of a microphone unit according to an embodiment of the present invention. FIG. 2 is an exploded perspective view illustrating the configuration of the microphone unit according to the present embodiment. FIG. 3 is a schematic cross-sectional view taken along the A-A line shown in FIG. 1. FIG. 4 is a schematic cross-sectional view taken along the B-B line shown in FIG. 2. FIG. 5 is a schematic cross-sectional view illustrating the configuration of an MEMS (Micro Electro Mechanical System) chip provided in the microphone unit according to the present embodiment. FIG. 6 is a diagram illustrating the circuit configuration of an ASIC (Application Specific Integrated Circuit) provided in the microphone unit according to the present embodiment. FIG. 7 is a schematic plan view illustrating the configuration of a top case provided in the microphone unit according to the present embodiment, viewed from the rear side thereof. Hereinafter, a microphone unit 1 according to the present embodiment will be described with reference to FIG. 1 through FIG. 7.

As shown in FIG. 1 and FIG. 2, the microphone unit 1 according to the present embodiment includes: a box-shaped bottom case 11; a substrate 12 on which an MEMS chip 14 and an ASIC 15 are mounted; and a top case 13 that is disposed so as to cover the substrate 12. Note that the bottom case 11 is an embodiment of a holding member according to the present invention. Likewise, the top case 13 is an embodiment of a cover member according to the present invention.

As shown in FIG. 2, the bottom case 11 has an approximately cuboid-shaped spatial area (concave space) 113 that is enclosed by a base wall 111 and four side walls 112. The spatial area 113 is formed so that the width (that is, the length in the X direction) and the depth (that is, the length in the Y direction) thereof are essentially the same size as the sizes of the substrate 12 (that is, the sizes in the X direction and the Y direction). It is preferable for the bottom case 11 to be formed of a resin. Furthermore, in consideration of a case in which the microphone unit 1 is mounted onto a mounting substrate (not shown) of a voice input device using reflow mounting, it is preferable for the bottom case 11 to be formed of a thermally-resistive resin such as, for example, an LCP (liquid crystal polymer), PPS (polyphenylene sulfide), or the like.

A depression 114 is formed in the base wall 111 of the bottom case 11, and is formed in an approximately rectangular shape when viewed from above. In addition, as shown in FIG. 2 and FIG. 4, multiple electrode terminals 115 and 116 are formed on the inner side and outer side, respectively, of the base wall 111 in the bottom case 11. These electrode terminals 115 and 116 include a power source electrode terminal that supplies power to the microphone unit 1, an output electrode terminal that outputs an electric signal generated by the microphone unit 1, and a ground connection electrode terminal.

Note that it is preferable for the bottom case 11 that includes the electrode terminals 115 and 116 to be formed as a single entity through, for example, insert molding, using a lead frame 117 (see FIG. 4) and a resin.

A circuit pattern 121 is formed on the top and bottom surfaces of the substrate 12, and the top and bottom circuit patterns are electrically connected to each other by a via hole (not shown). The circuit pattern on the top surface is formed so that, for example, the MEMS chip 14 and the ASIC 15 can be connected, power can be inputted, and electrical signals can be outputted. The circuit pattern on the bottom surface, meanwhile, is provided in order to electrically connect the substrate 12 to the electrode terminals 115 formed in the bottom case 11 when the substrate 12 is housed within the bottom case 12. As a result, the electrical components mounted on the substrate 12 (the MEMS chip 14 and the ASIC 15) can receive a supply of power, can output electric signals that have been produced to the exterior, and so on.

It should be noted that the substrate 12 is formed of an insulating material, but the specific material is not particularly limited; for example, the substrate 12 may be configured of a glass epoxy substrate, a polyamide substrate, a silicon substrate, a glass substrate, or the like. Here, it is preferable for the linear expansion coefficient of the substrate 12 to be close to the linear expansion coefficient of the MEMS chip 14. In the case where the MEMS chip 14 is formed of silicon, it is preferable for the linear expansion coefficient of the substrate 12 to be approximately 2.8 ppm/° C. Through this, it is possible to reduce the occurrence of residual stress on the MEMS chip 14 caused by heating and cooling during reflow mounting.

In addition, as shown in FIG. 2 and FIG. 3, a first opening 122 and a second opening 123 are formed in the substrate 12. These openings are provided in order to form a sound duct for leading sound waves from the exterior to a diaphragm provided in the MEMS chip 14. Details of this sound duct will be described later.

The MEMS chip 14 mounted on the substrate 12 will now be described with reference to FIG. 5. The MEMS chip 14 includes an insulating base substrate 141, a diaphragm film 142, an insulating film 143, and a fixed electrode 144, and forms a condenser microphone. Note that the MEMS chip 14 is manufactured using a semiconductor manufacturing technique.

An opening 141a that has an approximately circular shape when viewed from above is formed in the base substrate 141, and sound waves coming from below the diaphragm film 142 reach the diaphragm film 142 through this opening. The diaphragm film 142, which is formed upon the base substrate 141, is a thin film that vibrates (that is, vibrates up and down) upon being subjected to a sound wave, is conductive, and forms one end of an electrode.

The fixed electrode 144 is disposed so as to oppose the diaphragm film 142 with the insulating film 143 provided therebetween. Through this, the diaphragm film 142 and the fixed electrode 144 form a capacitance. Note that multiple sound holes 144a are formed in the fixed electrode 144 so that sound waves can pass through, and thus sound waves coming from above the diaphragm film 142 can reach the diaphragm film 142.

With this MEMS chip 14, when a sound wave enters into the MEMS chip 14, a sound pressure pf is applied to the top surface 142a of the diaphragm film 142 and a sound pressure pb is applied to the bottom surface 142b of the diaphragm film 142. As a result, the diaphragm film 142 vibrates in accordance with the difference between the sound pressure pf and the sound pressure pb, thus causing a gap Gp between the diaphragm film 142 and the fixed electrode 144 to change; this in turn causes the electrostatic capacitance between the diaphragm film 142 and the fixed electrode 144 to change. In other words, the MEMS chip 14, which functions as a condenser microphone, is capable of obtaining an electric signal from a sound wave that has entered.

Although the diaphragm film 142 is located below the fixed electrode 144 in the present embodiment, it should be noted that the configuration may be such that this relationship is inverted (that is, the diaphragm film is above and the fixed electrode is below).

The ASIC 15 mounted on the substrate 12 will now be described with reference to FIG. 6. The ASIC 15 is an integrated circuit that outputs an electric signal based on vibrations of the diaphragm film 142 in the MEMS chip 14. The ASIC 15 according to the present embodiment is configured so as to use a signal amplifier circuit 153 to amplify an electric signal based on a change in the capacity of the condenser formed by the MEMS chip 14, and output the amplified signal. In addition, the ASIC 15 is configured so as to include a charge pump circuit 151 and an op-amp 152, so that the change in the electrostatic capacitance of the condenser (that is, the MEMS chip 14) can be accurately obtained. Furthermore, the ASIC 15 is configured so as to include a gain adjustment circuit 154 so that the amplification factor (gain) of the signal amplifier circuit 153 can be adjusted. The electric signal that has been amplified by the ASIC 15 is outputted to and processed by, for example, a voice processing unit that is mounted on a mounting substrate (not shown) on which the microphone unit 1 is also mounted.

Note that in the present embodiment, both the MEMS chip 14 and the ASIC 15 are mounted on the substrate 12 using a flip chip process. The MEMS 14 and the ASIC 15 are electrically connected by a wiring pattern 121 formed in the substrate 12. Although the present embodiment employs a configuration in which the MEMS chip 14 and the ASIC 15 are mounted using a flip chip process, it should be noted that the configuration is not limited thereto, and a configuration in which the mounting is carried out using, for example, die bonding, wire bonding, or the like may be employed as well.

As shown in FIG. 2, the top case 13 has an approximately rectangular outer shape when viewed from above, and two sound holes 132 and 133, having approximately ellipsoidal shapes when viewed from above, are formed in an upper plate 131 of the top case 13. As shown in FIG. 7 (a diagram in which the top case 13 is viewed from the rear side thereof), an approximately cuboid-shaped first space portion 134 and an approximately elliptical column-shaped second space portion 135 are formed inside of the top case 13.

Note that the top case 13 is formed so that the width (that is, the length in the X direction) and the depth (that is, the length in the Y direction) thereof essentially match the sizes of the substrate 12 (that is, the sizes in the X direction and in the Y direction). In other words, the outer shape of the top case 13 has essentially the same width and depth as the spatial area 113 of the bottom case 11.

Meanwhile, it is preferable to form the top case 13 using a resin. Furthermore, in consideration of a case in which the microphone unit 1 is mounted onto a mounting substrate (not shown) of a voice input device using reflow mounting, it is preferable for the top case 13 to be formed of a thermally-resistive resin such as, for example, an LCP (liquid crystal polymer), PPS (polyphenylene sulfide), or the like.

The substrate 12 onto which the MEMS chip 14 and the ASIC 15 have been mounted is inserted into the bottom case 11, and the top case 13 is then inserted into the bottom case 11 so as to cover the substrate 12, thus configuring the microphone unit 1.

Note that in the present embodiment, the electrode terminals 115 in the bottom case 11 and the circuit pattern (electrode terminals) formed on the bottom surface of the substrate 12 are electrically affixed to each other through soldering, a conductive paste, or the like. The circuit pattern formed on the top surface of the substrate 12 and the circuit pattern formed on the bottom surface of the substrate 12 are electrically connected to each other using through wiring (not shown) that passes through the substrate 12. Furthermore, the substrate 12 and the top case 13 are affixed to each other using an adhesive. Further still, in order to prevent sound leakage from occurring in the microphone unit 1, a sealing resin 18, as shown in FIG. 1, is applied to the upper portions of the side walls in the bottom case 13 after the top case 13 has been inserted into the bottom case 11, so that gaps between the bottom case 11 and the top case 13 are covered. An epoxy-based resin, for example, is used as the sealing resin.

Next, the configuration of the microphone unit 1 according to the present embodiment will be described in further detail with reference primarily to FIG. 3. As shown in FIG. 3, an inner space 134 is formed between the top case 13 and the substrate 12 when the top case 13 is installed over the substrate 12 (note that the same reference numeral as the aforementioned first space portion of the top case 13 is used for the inner space). The MEMS chip 14 and the ASIC 15 are disposed within this inner space 134.

The inner space 134 communicates with the external space via a first sound hole 132 formed in the upper plate 131 of the top case 13 (see FIG. 2). In other words, a sound that has occurred outside of the microphone unit 1 passes through the first sound hole 132 and the inner space 134, and reaches the top surface (a first surface) 142a of the diaphragm film 142 provided in the MEMS chip 14 (see FIG. 5). In this sense, it can be said that the inner space 134 and the first sound hole 132 form a sound duct (a first sound duct 16).

As described above, the two openings 122 and 123 are formed in the substrate 12. Of these, the first opening 122 is provided so that the second space portion 135 in the top case 13 and the depression 114 formed in the bottom case 11 communicate with each other when the substrate 12 has been covered by the top case 13. The first opening 122 has the same shape and the same size as the second sound hole 133 in the top case 13. Furthermore, when the substrate 12 has been covered by the top case 13, a side surface of the second space portion 135 and a side surface of the first opening 122 form a single surface and communicate with the depression 114.

The second opening 123 formed in the substrate 12 is formed so that the diaphragm film 142 of the MEMS chip 14 mounted upon the substrate 12 and the depression 114 in the bottom case 11 communicate with each other. The second opening 123 has a size and shape that matches the vibrating area of the diaphragm film 142 (that is, has an approximately circular shape when viewed from above).

Note that the width (that is, the length in the X direction; see FIG. 2) of the depression 114 in the bottom case 11 is set so that the first opening 122 and the second opening 123 in the substrate 12 communicate with the depression 114 when the substrate 12 is housed and held within the bottom case 11. In addition, the depression 114 in the bottom case 11 is formed so that the depth (that is, the length in the Y direction; see FIG. 2) thereof is greater than the diameter of the vibrating area of the diaphragm film 142.

As described thus far, a sound that has occurred outside of the microphone unit 1 passes through the second sound hole 133, the second space portion 135, the first opening 122, the depression 114, and the second opening 123, and then reaches the bottom surface (second surface) 142b of the diaphragm film 142 in the MEMS chip 14 (see FIG. 5). In this sense, it can be said that the second sound hole 133, the second space portion 135, the first opening 122, the depression 114, and the second opening 123 form a sound duct (a second sound duct 17).

Note that the first sound duct 16 and the second sound duct 17 are formed so that the time required for a sound wave to move from the first sound hole 132 to the top surface 142a of the diaphragm film 142 is the same as the time required for a sound wave to move from the second sound hole 133 to the bottom surface 142b of the diaphragm film 142. It is preferable for the volume of the space that forms the first sound duct 16 and the second sound duct 17 to be 30 mm$^3$ or less, and further preferable for this volume to be 10 mm$^3$ or less (for example, approximately 7 to 8 mm$^3$). Furthermore, it is preferable for the volume of the space that forms the first sound duct 16 and the second sound duct 17 to be such that the volumes of the two sounds ducts are equal to within an error of ±30%.

In addition, it is preferable for the first sound hole 132 and the second sound hole 133 to have an area of greater than or equal to an area of a circle of ⌀0.5 mm and for the two sound holes to be formed having the same shape; the length of the ellipse in the lengthwise direction (that is, the Y direction in FIG. 2) and the length of the ellipse in the widthwise direction (that is, the X direction in FIG. 2) are set to that end. In order to prevent degradation in the acoustic properties, it is preferable for the width of the sound ducts to be greater than or equal to 0.1 mm, and preferable for the stated length in the widthwise direction to be greater than or equal to 0.1 mm. Note that in the same sense, it is preferable for the depth of the depression 114 provided in the bottom case 11 (see FIG. 3) to be greater than or equal to 0.1 mm.

Incidentally, it is not absolutely necessary for the first sound hole 132 and the second sound hole 133 to have approximately elliptical shapes (long-hole shapes) when viewed from above; the configuration thereof can be changed, and the shapes may be, for example, approximately circular shapes. However, it is easier to reduce the size of the microphone unit 1 and advantageous in terms of acoustical properties to employ a long-hole shape in which the lengthwise axis is vertical relative to the direction in which the first sound hole 132 and the second sound hole 133 are arranged, as in the present embodiment, and thus the long-hole shape is preferable.

The center distance L between the first sound hole 132 and the second sound hole 133 will now be discussed. If the distance between the first sound hole 132 and the second sound hole 133 is too small, the difference in the sound pressure that is applied to the top surface 142a and the bottom surface 142b of the diaphragm film 142 drops, leading to a drop in the amplitude of the diaphragm film 142; as a result, the SNR (S/N ratio) of the electric signal outputted from the ASIC 15 worsens. For this reason, it is preferable for the distance between the first sound hole 132 and the second sound hole 132 to be great to a certain degree. On the other hand, if the center distance L between the first sound hole 132 and the second sound hole 133 is too great, the difference between the amount of time required for sound wave emitted from a sound source to pass through the first sound hole 132 and reach the diaphragm film 142 and the amount of time required for the sound wave to pass through the second sound hole 133 and reach the diaphragm film 142, or in other words, the phase difference, will increase; this leads to a drop in the noise-canceling performance. For this reason, it is preferable for the center distance L between the first sound hole 132 and the second sound hole 133 to be not less than 4 mm and not more than 6 mm, and it is further preferable for the center distance L to be approximately 5 mm.

Next, operations of the microphone unit 1 will be described. Before describing these operations, the properties of sound waves will be discussed. The sound pressure of a sound wave (that is, the amplitude of the sound wave) is in inverse proportion with the distance from the sound source. Furthermore, the sound pressure attenuates drastically at locations that are close to the sound source, and attenuates gradually the further from the sound source.

For example, in the case where the microphone unit 1 is applied in a close-talking voice input device, the user's voice is emitted in the immediate vicinity of the microphone unit 1. For this reason, the user's voice is significantly attenuated between the first sound hole 132 and the second sound hole 133, and thus a large difference appears between the sound pressure that is applied to the top surface 142a of the diaphragm film 142 and the sound pressure that is applied to the bottom surface 142b of the diaphragm film 142.

Meanwhile, the sound sources of noise components such as background noise are present in locations that are farther from the microphone unit 1 than the user's voice. For this reason, the sound pressure of the noise undergoes almost no attenuation between the first sound hole 132 and the second sound hole 133, and thus almost no difference appears between the sound pressure that is applied to the top surface 142a of the diaphragm film 142 and the sound pressure that is applied to the bottom surface 142b of the diaphragm film 142.

The diaphragm film 142 of the microphone unit 1 vibrates due to a sound pressure difference between the sound waves that enter into the first sound hole 132 and the second sound hole 133 at the same time. As described above, because the difference in the sound pressure of noise that strikes the top surface 142a of the diaphragm film 142 and the bottom surface 142b of the diaphragm film 142 is extremely low, that sound pressure is canceled out by the diaphragm film 142. As opposed to this, the difference in the sound pressure of the user's voice that strikes the top surface 142a of the diaphragm film 142 and the bottom surface 142b of the diaphragm film 142 is large, and thus the user's voice causes the diaphragm film 142 to vibrate without being canceled out by the diaphragm film 142.

Accordingly, with the microphone unit 1, it can be thought that the diaphragm film 142 will vibrate only in response to the user's voice. For this reason, the electric signal outputted from the ASIC 15 of the microphone unit 1 can be thought of as a signal from which noise (background noise and the like) has been eliminated and that contains only the user's voice. In other words, according to the microphone unit 1 of the present embodiment, it is possible to obtain an electric signal from which noise has been eliminated and that contains only the user's voice, using a simple configuration.

As described thus far, the microphone unit 1 according to the present embodiment has a configuration that is not conventionally employed, in which the bottom case 11 is prepared, and the substrate 12 and the top case 13 are housed and held in the bottom case 13. With this configuration, the positional relationship between the substrate 12 and the top case 13 can be set to a desired relationship simply by inserting the substrate 12 and the top case 13 into the bottom case 11. Accordingly, it is possible to increase the efficiency of operations when assembling the microphone unit 1.

(Voice Input Device)

Figure 8:
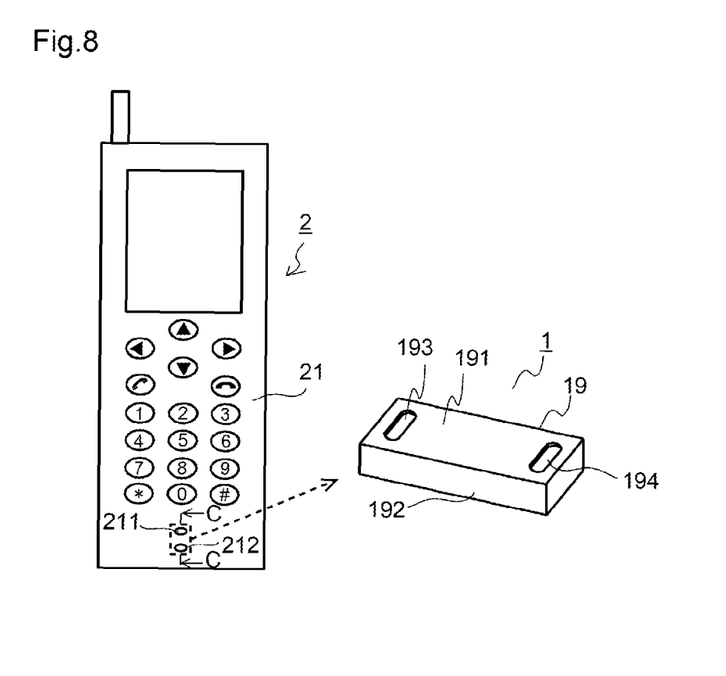
FIG. 8 is a diagram illustrating the schematic configuration of an embodiment of a voice input device in which the microphone unit according to the embodiment is applied.
Figure 9:
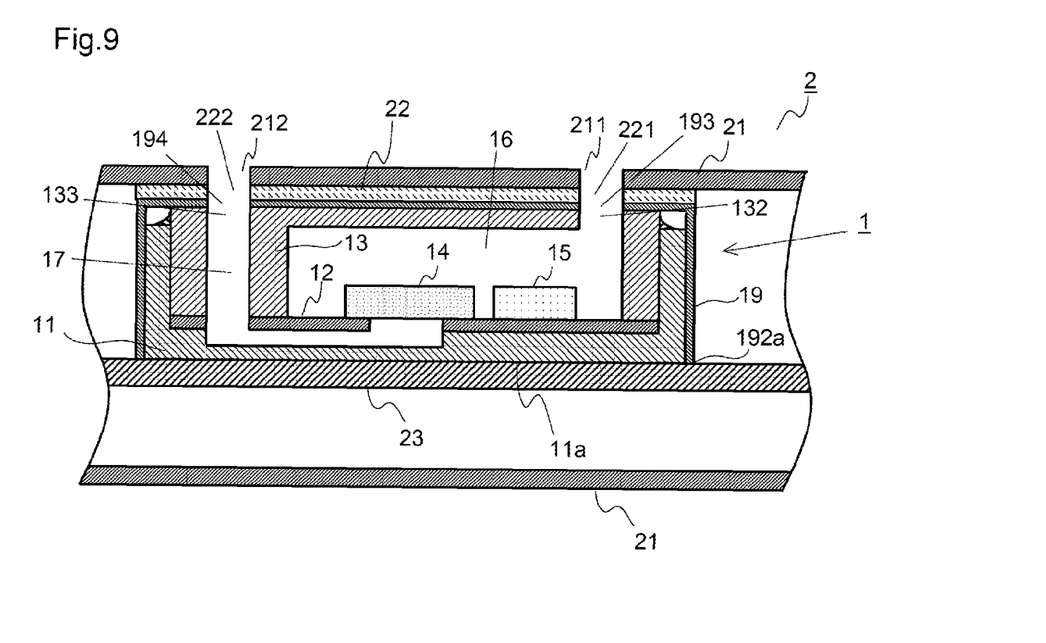
FIG. 9 is a schematic cross-sectional view taken along the C-C line shown in FIG. 8.

FIG. 8 is a diagram illustrating an embodiment of the schematic configuration of a voice input device in which the microphone unit according to the present embodiment is applied. FIG. 9 is a schematic cross-sectional view taken along the C-C line shown in FIG. 8. The configuration of a voice input device 2 in which the microphone unit 1 is applied will now be described with reference to FIG. 8 and FIG. 9. Here, a case in which the voice input device 2 is a mobile telephone will be described as an example, but the voice input device is of course not limited to a mobile telephone.

As shown in FIG. 8, two sound holes 211 and 212 are provided in a lower area of a housing 21 of the voice input device 2, and the user's voice is inputted into the microphone unit 1, which is disposed within the housing 21, via these sound holes 211 and 212. The microphone unit 1 disposed in the voice input device 2 is, as shown in FIG. 8 and FIG. 9, covered by a conductive shield cover 19 in order to suppress the influence of electromagnetic noise. Here, the microphone unit that is covered by the shield cover 19 is indicated by the reference numeral 1.

Note that the shield cover 19 may be formed of any material that has an electromagnetic shielding function, and therefore may be formed of a metallic material such as Kovar (an alloy in which nickel and cobalt are mixed with iron; an example of the component weight percent is 29% Ni, 17% Co, 0.2% Si, 0.3% Mn, and 53.5% Fe), alloy 42 (an Fe-42% Ni alloy), or the like.

The shield cover 19 contains an inner space that is surrounded by an upper plate 191 and four side walls 192. The shield cover 19 covers the top case 13 from above so that the shield cover 19 houses, in its inner space, the bottom case 11 that houses and holds the substrate 12 and the top case 13. In the present embodiment, the width (that is, the length in the horizontal direction in FIG. 9) and the depth (that is, the length in the vertical direction in FIG. 9) of the inner space of the shield case 19 are set so as to be approximately the same as the width and the depth, respectively, of the bottom case 11. For this reason, the shield case 19 is held by simply covering the top case 13 with the shield case 19 from above. In addition, the shield case 19 is formed so that bottom ends 192a of the side walls 192 and the bottom surfaces 11a of the bottom case 11 form a single surface when the top case 13 is covered by the shield case 19.

Two sound holes 193 and 194 are formed in the shield cover 19. To be more specific, the two sound holes 193 and 194 are formed so as to overlap with the two sound holes 132 and 133, respectively, that are formed in the top case 13. In addition, the microphone unit 1 is disposed so that the two sound holes 193 and 194 formed in the shield cover 19 overlap with the two sound holes 211 and 212, respectively, formed in the housing 21. For this reason, sound that has occurred outside of the housing 21 passes through the two sound ducts 16 and 17 provided in the microphone unit 1 and reaches the top surface 142a and the bottom surface 142b (for both, refer to FIG. 5) of the diaphragm film 142.

Note that in the voice input device 2 according to the present embodiment, an elastic member 22 is disposed between the housing 21 and the microphone unit 1. Openings 221 and 222 are formed in the elastic member 22 so that sound that has occurred outside of the housing 21 passes through the two sound ducts 16 and 17 provided in the microphone unit 1 and reaches the top surface 142a and the bottom surface 142b of the diaphragm film 142. It is not absolutely necessary to provide this elastic member 22. However, disposing the microphone unit 1 in the housing 21 with the elastic member 22 provided therebetween makes it difficult for vibrations from the housing 21 to be transmitted to the microphone unit 1, thereby increasing the operational accuracy of the microphone unit 1. For this reason, it is preferable to provide the elastic member 22, as is the case in the present embodiment.

As shown in FIG. 9, the microphone unit 1 disposed within the housing 21 is mounted upon a mounting substrate 23 provided within the housing 21. The mounting substrate 23 is configured so as to supply power to the microphone unit 1, process electric signals outputted from the microphone unit 1, and so on.

The microphone unit 1 is mounted upon the mounting substrate 23 using reflow mounting (a process carried out at, for example, 250° C.). Through this, the electrode terminals 16 (see FIG. 4) formed in the bottom case 11 of the microphone unit 1 and a circuit pattern formed in the mounting substrate 23 are affixed to and electrically connected to each other through soldering, a conductive paste, or the like. In addition, a side surface bottom end 192a of the shield case 19 and a ground (GND) formed in the mounting substrate 23 are soldered to and electrically connected to each other. Through this, the shield cover 19 acts as a shield against electromagnetic noise.

The foregoing has described the schematic configuration of the voice input device 2 in which the microphone unit 1 according to the present embodiment is applied; hereinafter, the effects of such a configuration will be described.

In the case where the microphone unit 1 is mounted on the mounting substrate 23, the mounting is carried out through reflow mounting at a high temperature (for example, approximately 200 to 250° C.), as described above. The various elements of which the microphone unit 1 is configured experience thermal expansion when processed at high temperatures in this manner. With respect to this point, as described earlier, in the conventional microphone unit 100 (see FIG. 13), the thermal expansion coefficients of the shield cover, which is formed of a metal, and the substrate (the substrate on which the MEMS chip is mounted), which is formed of a non-metal, differ significantly, which has led to cases in which the substrate has become warped and stress is applied to the MEMS chip as a result. There have been cases where the MEMS chip has been damaged due to this stress.

However, with the microphone unit 1 according to the present embodiment, the substrate 12 is held by the bottom case 11, which is formed using a resin such as LCP or the like. In this case, the bottom case 11 functions as a buffer material, which makes it unlikely that the substrate 12 will experience warping during a reflow mounting, even if the shield cover 19 is formed of a metal and the substrate 12 is formed of a non-metal. For this reason, with the voice input device 2 according to the present embodiment, the amount of stress applied to the MEMS chip 14 that is mounted on the substrate 12 can be reduced during reflow mounting, which makes it possible to reduce the possibility of problems in the properties occurring during assembly. In other words, it can be said that the voice input device 2 according to the present embodiment can be manufactured at high yields.

(Others)

The aforementioned embodiment is merely an example, and the microphone unit and voice input device according to the present invention are not limited to the configurations described in the aforementioned embodiment. Many variations can be carried out on the configuration described in the aforementioned embodiment without departing from the essential scope of the present invention.

For example, in the aforementioned embodiment, the configuration is such that the top case 13 is formed of a resin such as LCP or the like, and the shield cover 19 is placed thereupon from above to act as a shield from electromagnetic noise. However, the present invention is not limited to this configuration. The configuration may be such that the top case 13 is formed so as to include a conductive member that has electromagnetic shielding properties, and the top case 13 is electrically connected to a GND formed in the substrate 12. In this case, it is not necessary to further cover the top case 13 from above with the shield cover 19. Furthermore, the effect in which the efficiency of operations when assembling the microphone unit is improved as described above can be achieved in this case as well.

However, in the case where this configuration is employed, there is a higher likelihood of stress being applied to the MEMS chip when mounting the microphone unit onto the mounting substrate of the voice input device and problems in the properties thereof occurring as a result. For this reason, it is preferable to employ a configuration in which the shield cover 19 is provided separately from the top case 13, and the substrate 12 and the shield cover 19 are not directly connected (that is, are separated from each other), as in the embodiment.

Figure 10:
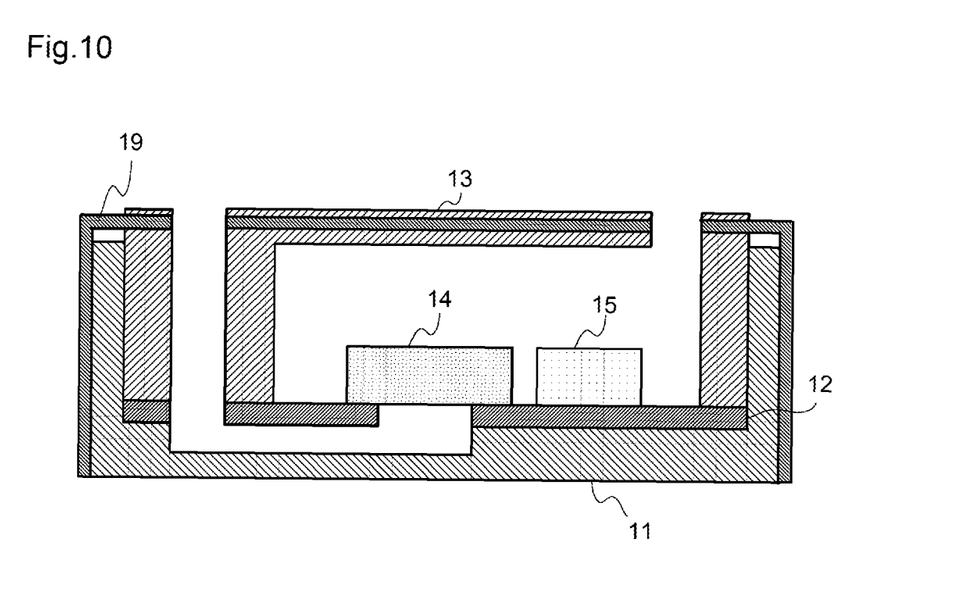
FIG. 10 is a schematic cross-sectional view illustrating another embodiment of a microphone unit in which the present invention is applied.

Meanwhile, as another configuration, the shield cover 19 may be formed integrally with the top case 13, as shown in FIG. 10. This makes it possible to reduce the overall number of components and simplify the manufacturing process, while at the same time maintaining the aforementioned advantages of an improvement in the efficiency of operations during assembly and a reduction in the occurrence rate of problems in the properties during mounting onto the voice input device. Furthermore, with this configuration, the side walls of the bottom case 11 are sandwiched between and held by the shield cover 19 and the top case 13 using the metallic spring force of the shield cover 19, which makes it possible to fix the top case 13 to the bottom case 11. Note that it is possible to adjust the stated spring force by providing a slit in a part of the side walls of the shield cover 19, and thus a slit may be provided in the side walls of the shield cover 19 as appropriate.

Figure 11:
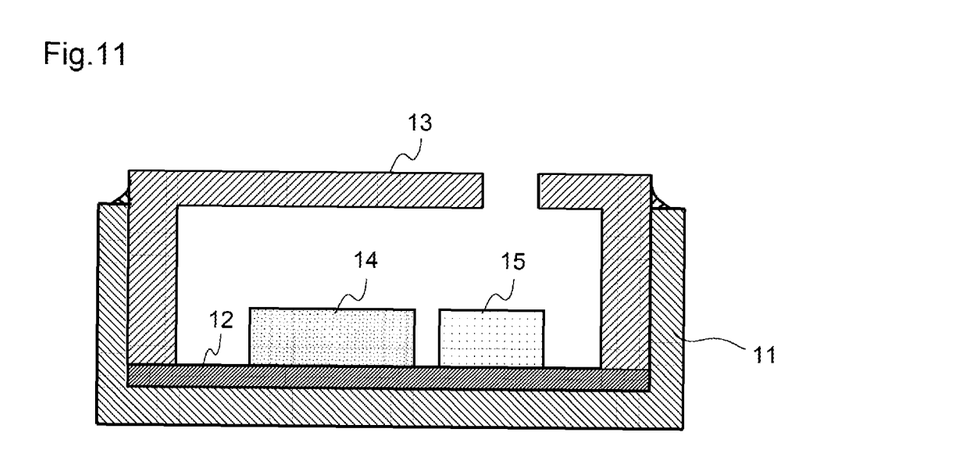
FIG. 11 is a schematic cross-sectional view illustrating another embodiment of a microphone unit in which the present invention is applied.

In addition, the aforementioned embodiment describes a case in which the microphone unit is configured so that the diaphragm film (diaphragm) 142 vibrates based on a difference in the sound pressures applied to the top surface 142a and the bottom surface 142b thereof. However, the configuration of the microphone unit in which the present invention is applied is not limited to the configuration described in the aforementioned embodiment. For example, as shown in FIG. 11, the microphone unit may have a configuration in which the diaphragm (provided in the MEMS chip 14) vibrates from the sound pressure applied to only one of the surfaces of the diaphragm. In the case of this configuration, it is not necessary to provide the depression 114 in the bottom case 11 as described in the aforementioned embodiment, and furthermore, only one sound duct is necessary.

In addition, in the aforementioned embodiment, the configuration is such that the microphone unit 1 includes the bottom case 11. However, if the configuration includes a holding member that holds only the substrate 12 or both the substrate 12 and the top case 13, the efficiency of operations during assembly can be improved, and a configuration such as that shown in, for example, FIG. 12 may be employed.

Figure 12:
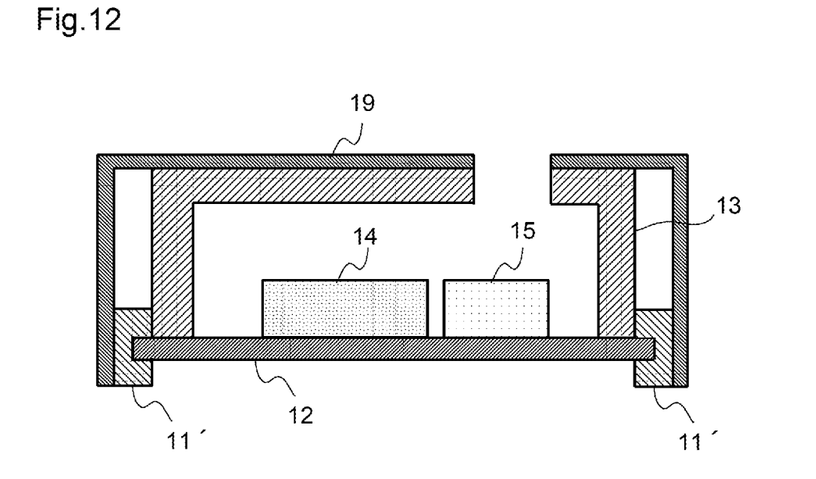
FIG. 12 is a schematic cross-sectional view illustrating another embodiment of a microphone unit in which the present invention is applied.

The configuration shown in FIG. 12 includes a holding member 11' that grips and holds the substrate 12, instead of the bottom case 11. Even in this case, the top case 13 is guided to the covering position by the holding member 11', and thus the top case 13 can be attached without carrying out troublesome positional adjustments. In other words, the efficiency of operations during the assembly of the microphone unit can be improved beyond that of the conventional microphone unit. Furthermore, because the holding member 11' is provided, it is easier to implement a configuration in which the substrate 12 and the shield cover 19 (connected to the GND of the mounting substrate onto which the microphone unit is mounted) are not connected, as shown in FIG. 12, in the case where the top case 13 is covered by the shield cover 19 from above. Further still, if this configuration is employed, the holding member 11' acts as a buffer material when the microphone unit is mounted onto the voice input device using reflow mounting, which in turn makes it possible to reduce the likelihood of problems occurring in the properties of the MEMS chip 14.

In addition, although the MEMS chip 14 and the ASIC 15 are configured of separate chips in the aforementioned embodiment, the integrated circuit provided in the ASIC 15 may be formed monolithically upon the silicon substrate of which the MEMS chip 14 is formed.

In addition, although the aforementioned embodiment describes a configuration in which the microphone chip for converting voice into an electric signal is the MEMS chip 14, which is formed using a semiconductor manufacturing technique, the configuration of the embodiment is not limited thereto. Furthermore, in the aforementioned embodiment, a so-called condenser microphone is employed as the configuration of the microphone chip (this corresponds to the MEMS chip 14 according to the embodiment) provided in the microphone unit 1. However, the present invention can also be applied in a microphone unit that employs a configuration aside from a condenser microphone. For example, the present invention can also be applied in a microphone unit that employs a dynamic microphone, a magnetic microphone, a piezoelectric microphone, or the like.

Furthermore, the shape of the microphone unit is not intended to be limited to the shape described in the aforementioned embodiment, and can of course be changed to various shapes. Moreover, in addition to mobile telephones, voice communication devices such as transceivers, voice processing systems that employ techniques for analyzing inputted voice (voice authentication systems, voice recognition systems, command generation systems, electronic dictionaries, translation devices, voice-activated remote controllers, and so on), voice recording devices and amplification systems (amplifiers), microphone systems, and the like can be given as other examples of voice input devices in which the present invention can be applied.

INDUSTRIAL APPLICABILITY

The present invention is useful in voice communication devices such as mobile telephones, transceivers, or the like, information processing systems that use techniques for analyzing inputted voice, such as voice authentication systems, and so on, voice recording devices, and so on.

| EXPLANATION OF REFERENCE NUMERALS | |
|---|---|
| 1 | microphone unit |
| 2 | voice input device |
| 11 | top case (holding member) |
| 11' | holding member |
| 12 | substrate |
| 13 | top case (cover member) |
| 14 | MEMS chip |
| 16 | first sound duct |
| 17 | second sound duct |
| 19 | shield cover |
| 23 | mounting substrate |
| 111 | base wall |
| 112 | side wall |
| 113 | spatial area |
| 114 | depression |
| 132 | first sound hole |
| 133 | second sound hole |
| 134 | inner space |
| 142 | diaphragm film (diaphragm) |
| 142a | top surface of diaphragm film (first surface) |
| 142b | bottom surface of diaphragm film (second surface) |
| 193, 194 | shield cover sound holes |

The invention claimed is:

1. A microphone unit that converts voice into an electric signal based on the vibration of a diaphragm, the microphone unit comprising:
   a substrate on which the diaphragm is mounted;
   a cover member, having a sound hole, that is disposed above the substrate so that the diaphragm is contained within the inner space formed between the substrate and the cover member; and
   a holding member that holds only the substrate or both the cover member and the substrate,
   wherein the holding member includes a spatial area formed by a base wall and side walls;
   the substrate and the cover member are housed and held within the spatial area; and
   wherein a depression is formed in the base wall;
   wherein the sound hole formed in the cover member include a first sound hole and a second sound hole; and
   a first sound duct leading from the first sound hole to a first surface of the diaphragm, and a second sound duct leading from the second sound hole through the depression and to a second surface that is the rear surface of the first surface of the diaphragm, are formed.

2. The microphone unit according to claim 1,
wherein the diaphragm is contained in an MEMS chip and the MEMS chip is mounted upon the substrate.

3. A microphone unit that converts voice into an electric signal based on the vibration of a diaphragm, the microphone unit comprising:
a substrate on which the diaphragm is mounted;
a cover member, having a sound hole, that is disposed above the substrate so that the diaphragm is contained within the inner space formed between the substrate and the cover member; and
a holding member that holds only the substrate or both the cover member and the substrate, and
a conductive shield cover having a sound hole,
wherein the sound hole in the cover member and the sound hole in the shield cover overlap, and the shield cover is provided so that the holding member is contained within the shield cover.

4. The microphone unit according to claim 3,
wherein the shield cover and the cover member are separate members, and the cover member is covered by the shield cover from above.

5. The microphone unit according to claim 3,
wherein the shield cover and the cover member are formed as a single member.

6. A voice input device comprising:
a microphone unit according to claim 3; and
a mounting substrate upon which the microphone unit is mounted,
wherein the shield cover is electrically connected to a ground formed in the mounting substrate.

7. The voice unit device of claim 6, wherein the shield cover and the cover member of the microphone unit are separate members, and the cover member is covered by the shield cover from above.

8. The voice unit device of claim 6, wherein the shield cover and the cover member of the microphone unit are formed as a single member.

9. A voice input device comprising:
a diaphragm; and
a microphone unit that converts voice into an electric signal based on the vibration of a diaphragm,
wherein the microphone unit comprises:
a substrate on which the diaphragm is mounted;
a cover member, having a sound hole, that is disposed above the substrate so that the diaphragm is contained within the inner space formed between the substrate and the cover member; and
a holding member that holds only the substrate or both the cover member and the substrate,
wherein the holding member includes a spatial area formed by a base wall and side walls;
the substrate and the cover member are housed and held within the spatial area and
wherein a depression is formed in the base wall,
wherein the sound hole formed in the cover member of the microphone unit includes a first sound hole and a second sound hole; and
a first sound duct leading from the first sound hole to a first surface of the diaphragm, and a second sound duct leading from the second sound hole through the depression and to a second surface that is the rear surface of the first surface of the diaphragm, are formed.

10. The voice input device according to claim 9,
wherein the diaphragm of the microphone unit is contained in an MEMS chip and the MEMS chip is mounted upon the substrate.

11. A voice input device comprising:
a diaphragm; and
a microphone unit that converts voice into an electric signal based on the vibration of a diaphragm,
wherein the microphone unit comprises:
a substrate on which the diaphragm is mounted;
a cover member, having a sound hole, that is disposed above the substrate so that the diaphragm is contained within the inner space formed between the substrate and the cover member;
a holding member that holds only the substrate or both the cover member and the substrate, and
a conductive shield cover having a sound hole,
wherein the holding member includes a spatial area formed by a base wall and side walls;
the substrate and the cover member are housed and held within the spatial area;
wherein a depression is formed in the base wall, and
the sound hole in the cover member and the sound hole in the shield cover overlap, and the shield cover is provided so that the holding member is contained within the shield cover.

12. The voice input device according to claim 11,
wherein the shield cover and the cover member of the microphone unit are separate members, and the cover member is covered by the shield cover from above.

13. The voice input device according to claim 11,
wherein the shield cover and the cover member of the microphone unit are formed as a single member.

14. The voice input device according to claim 11, wherein the sound hole formed in the cover member of the microphone unit includes a first sound hole and a second sound hole; and
a first sound duct leading from the first sound hole to a first surface of the diaphragm, and a second sound duct leading from the second sound hole through the depression and to a second surface that is the rear surface of the first surface of the diaphragm, are formed.

15. The voice input device according to claim 11, wherein the diaphragm of the microphone unit is contained in an MEMS chip and the MEMS chip is mounted upon the substrate.

* * * * *